United States Patent
Chen

(10) Patent No.: US 11,244,843 B2
(45) Date of Patent: Feb. 8, 2022

(54) FIXING DEVICE AND METHOD OF MANUFACTURING DISPLAY PANEL

(71) Applicant: TCL China Star Optoelectronics Technology Co., Ltd., Guangdong (CN)

(72) Inventor: Hao Chen, Guangdong (CN)

(73) Assignee: TCL CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 16/619,032

(22) PCT Filed: Nov. 13, 2019

(86) PCT No.: PCT/CN2019/117898
§ 371 (c)(1),
(2) Date: Dec. 3, 2019

(87) PCT Pub. No.: WO2021/077488
PCT Pub. Date: Apr. 29, 2021

(65) Prior Publication Data
US 2021/0125845 A1    Apr. 29, 2021

(30) Foreign Application Priority Data

Oct. 25, 2019    (CN) .......................... 201911022516.5

(51) Int. Cl.
*H01L 21/67* (2006.01)
*H01L 21/673* (2006.01)
*H01L 23/00* (2006.01)

(52) U.S. Cl.
CPC ........ *H01L 21/6734* (2013.01); *H01L 23/562* (2013.01)

(58) Field of Classification Search
CPC .......................... H01L 21/6734; H01L 23/562
See application file for complete search history.

(56) References Cited

U.S. PATENT DOCUMENTS

| | | | | |
|---|---|---|---|---|
| 2003/0164436 A1* | 9/2003 | Rooker | ................... | G09F 21/04 248/441.1 |
| 2005/0284992 A1* | 12/2005 | Coble | ..................... | B42F 1/006 248/206.5 |
| 2009/0310337 A1* | 12/2009 | Patterson | .................. | G06F 1/00 362/97.1 |
| 2010/0149734 A1* | 6/2010 | Sakata | .................. | G06F 1/1601 361/679.01 |

(Continued)

FOREIGN PATENT DOCUMENTS

| CN | 202411612 U | 9/2012 |
|---|---|---|
| CN | 205522961 U | 8/2016 |

(Continued)

*Primary Examiner* — Mohammed Shamsuzzaman
(74) *Attorney, Agent, or Firm* — The Roy Gross Law Firm, LLC; Roy Gross

(57) ABSTRACT

The present disclosure provides a fixing device and a method of manufacturing a display panel, the fixing device including a carrier plate provided with a fixing member, wherein the fixing member includes at least two opening regions, an area of the opening region is adjustable, the opening region is configured for accommodating the display panel.

17 Claims, 4 Drawing Sheets

(56) References Cited

U.S. PATENT DOCUMENTS

| | | | | |
|---|---|---|---|---|
| 2014/0104826 A1* | 4/2014 | Bergdoll | ................ | F21V 21/00 |
| | | | | 362/223 |
| 2015/0342372 A1* | 12/2015 | Chafe | ................. | A47G 1/1606 |
| | | | | 40/711 |
| 2016/0369980 A1* | 12/2016 | Lan | ........................... | G09F 9/33 |
| 2017/0059087 A1* | 3/2017 | Lam | .................... | F16M 11/048 |
| 2017/0133411 A1 | 5/2017 | Xie et al. | | |

FOREIGN PATENT DOCUMENTS

| | | | |
|---|---|---|---|
| CN | 106992139 A | 7/2017 | |
| CN | 207766682 U | 8/2018 | |
| CN | 207783322 U | 8/2018 | |
| CN | 110176553 A | 8/2019 | |
| JP | 2014110331 A | 6/2014 | |

* cited by examiner

FIXING DEVICE AND METHOD OF MANUFACTURING DISPLAY PANEL

FIELD OF INVENTION

The present disclosure relates to the field of display technology, and more particularly to a fixing device and a method of manufacturing a display panel.

BACKGROUND OF INVENTION

Currently, display panels are diversified, wherein the resolution and color of mini LED devices are closer to organic light emitting diode (OLED) displays. Mini LED devices are superior to liquid crystal displays (LCDs), and having lower power consumption, being lighter and thinner. However, after cutting, the mini LED device are sliced, and an edge of the slice is sharp, and the slicing process risks fragmentation. Therefore, it is necessary to perform edging after cutting to increase the strength and reduce the risk of fragmentation.

In order to protect the surface of the substrate, the substrate is coated with a protective layer, and after the edging, the protective layer is removed by a stripper. However, in the stripping process, the slice needs to be fixed. As shown in FIG. 1 and FIG. 2, the currently fixing device includes a substrate 10 and a dam 12 attached to the substrate 10, the dam 12 is attached to the substrate 10 by a colloid 11. Then the slice 12 is placed in an area 101 defined by the bar 12. However, the slices of different sizes need to be separately fixed, that is, the slices of different sizes cannot be accommodated, which reduces efficiency and flexibility of production.

Therefore, it is necessary to provide a fixing device and a method of manufacturing a display panel to solve the problems existing in the prior art.

SUMMARY OF INVENTION

The present disclosure provides a display panel and a method of manufacturing a display device, to improve the efficiency and flexibility of production.

To solve the above problems, the present disclosure provides a fixing device, the fixing device is used for fixing a display panel, including:

a carrier plate provided with a fixing member, wherein the fixing member comprises at least two opening regions, an area of the opening region is adjustable, the opening region is configured for accommodating the display panel, and the carrier plate is provided with multiple holes;

wherein the fixing member comprises a plurality of first movable bars and a plurality of second movable bars, each of the first movable bar is disposed to intersect with each of the second movable bar, and an intersection of the first movable bar and the second movable bar is connected by a movable connection member.

The present disclosure provides a fixing device including:

a carrier plate provided with a fixing member, the fixing member comprises at least two opening regions, an area of the opening region is adjustable, wherein the opening region is used for accommodating the display panel.

The present disclosure further provides a method of manufacturing a display panel, comprising steps of:

providing a protective layer on a display panel to be cut;

dividing the display panel to be cut into a plurality of target display panels, and performing edging processing on the plurality of target display panel, wherein an area of each of the target display panel is smaller than an area of the display panel to be cut;

adjusting a size of an opening region of a fixing member in a fixing device to place the edging target display panel into a corresponding opening region; and removing the protective layer on the target display panel.

The present disclosure provides a fixing device and a method of manufacturing a display panel, by providing a fixing member on the carrier plate, wherein the fixing member includes at least two opening regions, an area of the opening region is adjustable, the opening region is configured for accommodating the display panel, and since an area of the opening region is adjustable, conveniently fixing multiple sizes of panels, improving the efficiency and flexibility of production.

DETAILED DESCRIPTION OF PREFERRED EMBODIMENTS

Figure 1:
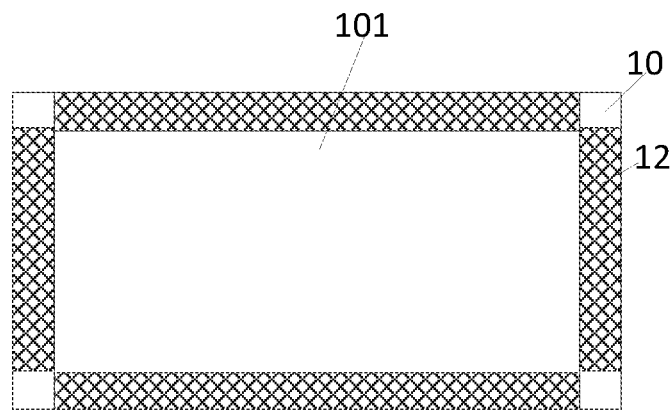
FIG. 1 is a plan view of a current fixing device.
Figure 2:
FIG. 2 is a cross-sectional view of a current fixing device.

The following description of the various embodiments is provided to illustrate the specific embodiments of the present disclosure. The directional terms mentioned in the present disclosure, such as "upper", "lower", "before", "after", "left", "right", "inside", "outside", "side", etc., are merely references of the direction of the drawing. Therefore, the directional terms are used for illustration and understanding, not for limit the present disclosure. In the figures, units with similar structures are labeled with the same reference number.

Figure 3:
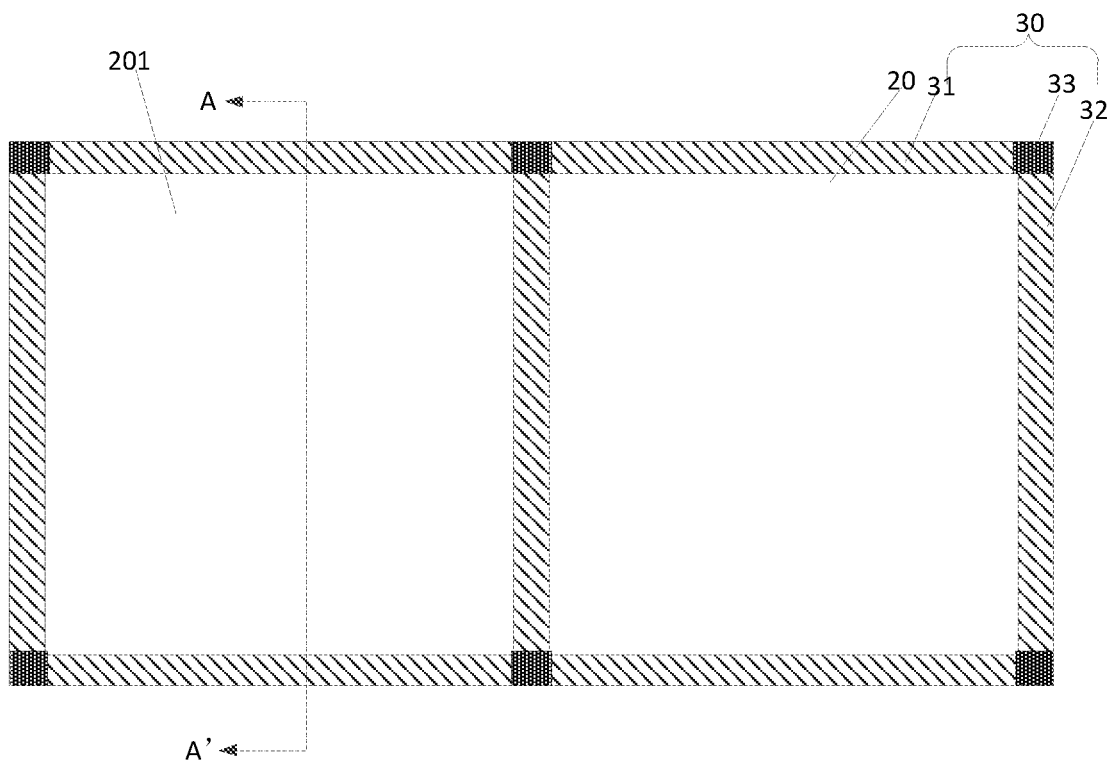
FIG. 3 is a plan view showing a fixing device according to a first embodiment of the present disclosure.
Figure 4:
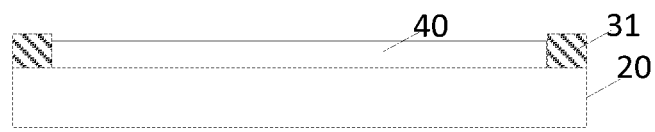
FIG. 4 is a cross-sectional view showing a fixing device according to a first embodiment of the present disclosure.
Figure 5:
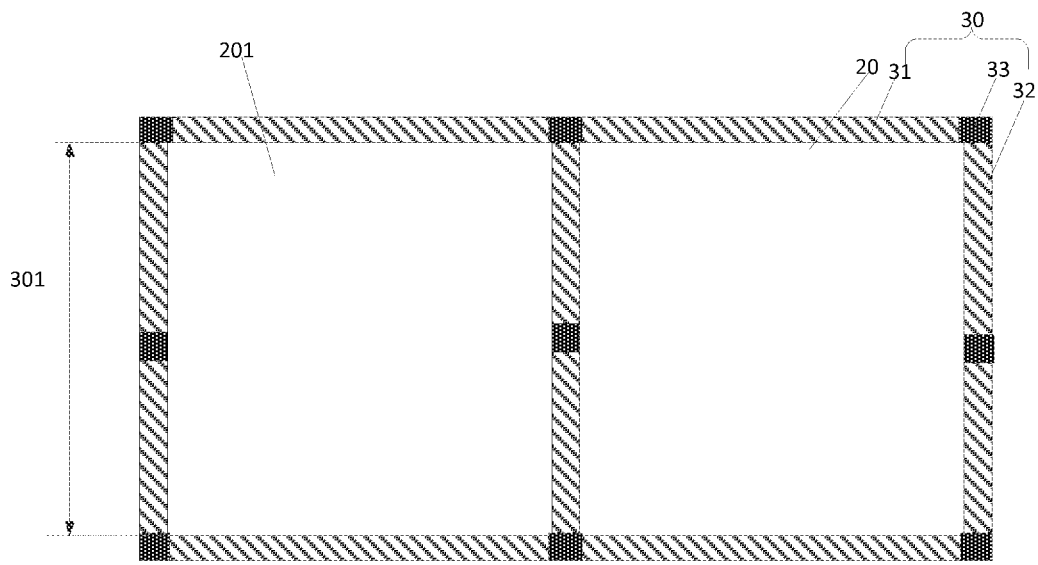
FIG. 5 is a plan view showing a preferred embodiment of the fixing device of the first embodiment of the present disclosure.

Please refer from FIG. 3 to FIG. 5, FIG. 3 is a plan view of a fixing device according to embodiment 1 of the present disclosure.

Combined with FIG. 3 and FIG. 4, the fixing device of the embodiment is used for fixing a display panel, and the fixing device includes: a carrier plate 20.

The carrier plate 20 is provided with a fixing member 30. The fixing member 30 includes two opening regions 201, and an area of the opening region 201 is adjustable, the opening region 201 is configured for accommodating the display panel 40 to define the display panel 40 within the open region 201. It is to be understood that the number of the opening regions 201 is not limited to two. In an embodiment, a thickness of the carrier plate 20 ranging from 1 mm to 2 mm. Of course, the thickness of the carrier plate 20 is not limited thereto. FIG. 4 is a cross-sectional view in the longitudinal direction of FIG. 3, specifically a cross-sectional view taken along line AA' in FIG. 3.

In an embodiment, in order to facilitative adjust an area of the opening region and improve adjustment efficiency, the fixing member 30 includes two first movable bars 31 and three second movable bars 32, each of the first movable bar 31 is disposed to intersect with each of the second movable bar 32, and an intersection of the first movable bar 31 and the second movable bar 32 is connected by a movable connection member 33. Each of the second movable bar 32 is reciprocally movable in a first direction, each of the first movable bar 31 is reciprocally movable in a second direction, and the first direction intersects the second direction. For example, the first movable bars 31 may be arranged in a horizontal direction, and the second movable bars 32 may be arranged in a vertical direction. The first movable bar 31 can move up and down, and the second movable bar 32 can move left and right. When the first movable bar is moved, a width of the opening region can be adjusted, and when the second movable bar is moved, a length of the opening region can be adjusted, and when the first movable bar and the second movable bar are simultaneously moved, the length and the width of the opening region can be simultaneously adjusted. It can be understood that the number of the first movable bars 31 and the second movable bars 32 are not limited.

In order to simplify the manufacturing process and reduce the production cost, a material of the carrier plate 20, a material of the first movable bar 31, and a material of the second movable bar 32 are all metal materials, that is, a material can be attracted magnetically. The movable connecting member 33 is a magnetic snap so that the first movable bar 31 and the second movable bar 32 are both attracted to the carrier plate 20. In the using process, for example, when it is necessary to adjust the length of the open region on the left side, the size in the horizontal direction, the upper and lower magnetic latches are removed, and the first movable bar 31 is moved to the right. When the movement is completed, the magnetic snap is buckled at the intersection of the first movable bar 31 and the second movable bar 32.

As shown in FIG. 5, in order to improve the connection stability between the fixing member and the carrier plate, the setting area 301 in the second movable bar 32 is also provided with the movable connecting member 33, and the setting area 301 is an area between two adjacent first movable bars 31. Further, the movable connecting member 33 is disposed at an intermediate position of the setting area 301 in the second movable bar 32. For example, the intermediate position of the second movable bar 32 is also provided with a magnetic snap.

It can be understood that the specific structure of the fixing member is not limited, and other existing structures can realize the movement of the first movable bar 31 and the second movable bar 32 may be employed.

Figure 6:
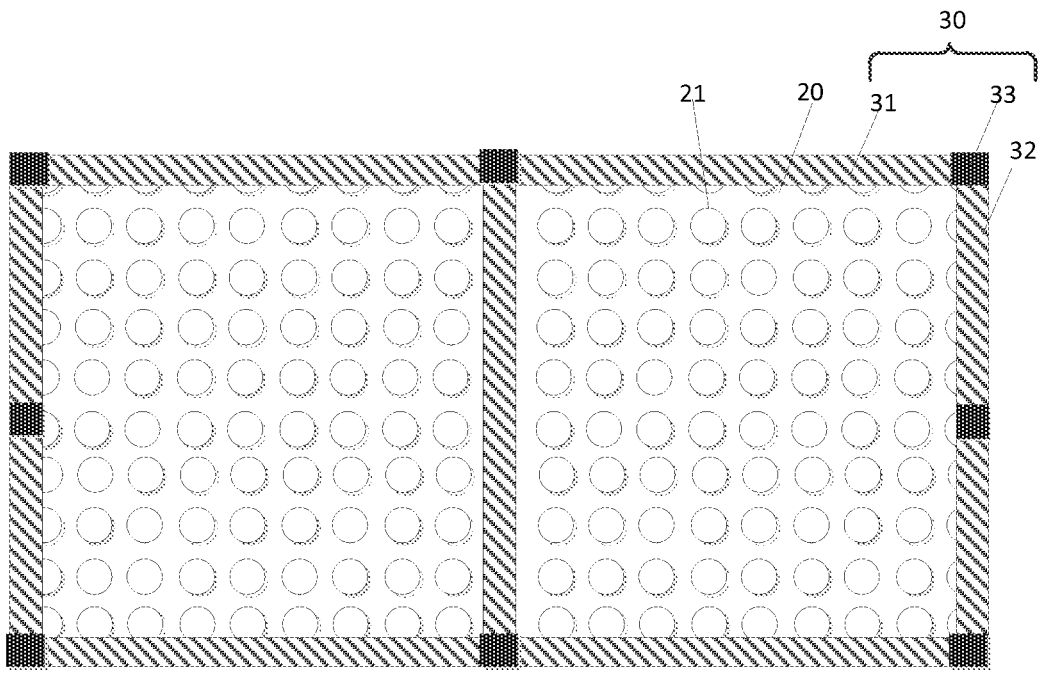
FIG. 6 is a plan view of a fixing device according to a second embodiment of the present disclosure.
Figure 7:
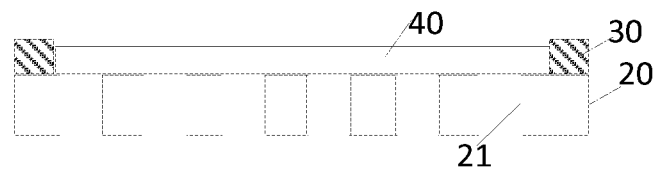
FIG. 7 is a cross-sectional view showing a fixing device according to a second embodiment of the present disclosure.

Please refer to FIG. 6 and FIG. 7, FIG. 6 is a plan view of a fixing device according to a second embodiment of the present disclosure.

As shown in FIG. 6 and FIG. 7, the fixing device of this embodiment differs from the previous embodiment in that the carrier plate 20 is provided with multiple holes 21. Each of the holes 21 is a through hole, and the shape of each of the holes 21 is not limited, which may be a circular, a triangular, or a rectangular shape. The holes 21 may be arranged regularly or in a disorderly arrangement. The multiple holes 21 may be disposed at intervals or may be overlapped.

Since the carrier plate 20 is provided with a plurality of holes, the residual liquid can be prevented in the subsequent peeling process, and improving the production yield.

In order to further prevent the residual liquid, a diameter of each of the multiple holes 21 ranges from 5 mm to 10 mm. Of course, the diameter range of the holes is not limited to this.

Figure 8:
FIG. 8 is a schematic structural view of a first step of the method of manufacturing the display panel of the present disclosure.

The present disclosure also provides a method of manufacturing a display panel, including steps of:

S101. providing a protective layer on a display panel to be cut;

As shown in FIG. 8, a protective layer 51 is disposed on the display panel 50 to be cut, wherein the protective layer 51 has a thickness ranges from 2 um to 3 um. A material of the protective layer 51 is a photoresist material.

Figure 9:
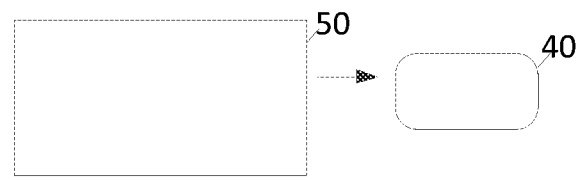
FIG. 9 is a plan view of a second step of the method of manufacturing the display panel of the present disclosure.

S102. dividing the display panel to be cut into a plurality of target display panels, and performing edging processing on the plurality of target display panel;

As shown in FIG. 9, dividing the display panel to be cut 50 into at least one target display panel 40, and performing edging processing on the at least one target display panel 40, wherein an area of each of the target display panel 40 is smaller than an area of the display panel to be cut 50.

Figure 10:
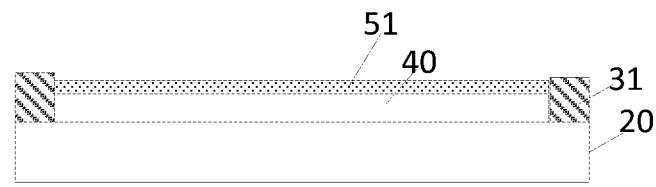
FIG. 10 is a schematic structural view of a third step of the method of manufacturing the display panel of the present disclosure.

S103, adjusting a size of an opening region of a fixing member in a fixing device to place the edging target display panel into a corresponding opening region;

As shown in FIG. 10, in an embodiment, by adjusting at least one of the first movable bar and the second movable bar, adjusting a size of an opening region, that is, adjusting a size of an opening region to a desired size, and placing the target display panel 40 into the opening region.

S104. removing the protective layer on the target display panel.

Please refer to FIG. 3, in one embodiment, removing the protective layer 51 on the target display panel 40. It can be understood that the target display panel of this embodiment is equivalent to the display panel of the first embodiment.

It can be understood that the manufacturing method is also applicable to the second embodiment, and the specific manufacturing process is the same as that, details are not described herein again.

Since the carrier plate is provided with the fixing member, the fixing member includes at least two opening regions, and the area of the opening region is adjustable; since the area of the opening region is adjustable, conveniently fixing multiple sizes of panels, improving the efficiency and flexibility of production, and reducing the cost of manufacturing.

The present disclosure provides a fixing device and a method of manufacturing a display panel, by providing a fixing member on the carrier plate, wherein the fixing member includes at least two opening regions, an area of the opening region is adjustable, the opening region is configured for accommodating the display panel, and since an area of the opening region is adjustable, conveniently fixing multiple sizes of panels, improving the efficiency and flexibility of production, and reducing the cost of manufacturing.

In the above, the present disclosure has been disclosed in the above preferred embodiments, but the preferred embodiments are not intended to limit the present disclosure, those skilled in the art can make various modifications without departing from the spirit and scope of the present disclosure. The protective scope of the present disclosure is defined by the scope of the claims.

What is claimed is:

1. A fixing device, the fixing device used for fixing a display panel, comprising:
   a carrier plate provided with a fixing member, wherein the fixing member comprises at least two opening regions, an area of the opening regions is adjustable, the opening regions are configured to accommodate the display panel, and the carrier plate is provided with a plurality of holes;
   wherein the fixing member comprises a plurality of first movable bars and a plurality of second movable bars, each of the first movable bars is disposed to intersect with each of the second movable bars, and an intersection between each of the first movable bars and each of the second movable bars is connected by a movable connection member; and
   materials of the carrier plate, the first movable bars, and the second movable bars are metal material, and the movable connection member is a magnetic buckle.

2. The fixing device as claimed in claim 1, wherein a setting area in each of the second movable bar is also provided with the movable connection member; and the setting area is an area between two adjacent first movable bars.

3. The fixing device as claimed in claim 1, wherein each of the second movable bars is reciprocally movable in a first direction, each of the first movable bars is reciprocally movable in a second direction; and the first direction intersects the second direction.

4. The fixing device as claimed in claim 1, wherein a diameter of each of the holes ranges from 5 mm to 10 mm.

5. The fixing device as claimed in claim 1, wherein a thickness of the carrier plate ranges from 1 mm to 2 mm.

6. The fixing device as claimed in claim 1, wherein a top view shape of the holes comprises at least one of a circle, a triangle, and a rectangle.

7. A fixing device, the fixing device is used for fixing a display panel, comprising:
   a carrier plate provided with a fixing member, the fixing member comprises at least two opening regions, an area of the opening regions is adjustable, wherein the opening regions are configured to accommodate the display panel; and
   the fixing member comprises a plurality of first movable bars and a plurality of second movable bars, each of the first movable bars is disposed to intersect with each of the second movable bars, and an intersection between each of the first movable bars and each of the second movable bars is connected by a movable connection member.

8. The fixing device as claimed in claim 7, wherein materials of the carrier plate, the first movable bars, and the second movable bars are metal materials, and the movable connection member is a magnetic buckle.

9. The fixing device as claimed in claim 8, wherein a setting area in each of the second movable bars is also provided with the movable connection member; and
   the setting area is an area between two adjacent first movable bars.

10. The fixing device as claimed in claim 7, wherein each of the second movable bars is reciprocally movable in a first direction, each of the first movable bars is reciprocally movable in a second direction, and
    the first direction intersects the second direction.

11. The fixing device as claimed in claim 7, wherein the carrier plate is provided with a plurality of holes.

12. The fixing device as claimed in claim 11, wherein a diameter of each of the holes ranges from 5 mm to 10 mm.

13. The fixing device as claimed in claim 11, wherein a top view shape of the holes comprises at least one of a circle, a triangle, and a rectangle.

14. The fixing device as claimed in claim 7, wherein a thickness of the carrier plate ranges from 1 mm to 2 mm.

15. A method of manufacturing a display panel, comprising steps of:
    providing a protective layer on a display panel to be cut;
    dividing the display panel to be cut into a plurality of target display panels, and performing edging processing on the plurality of target display panels, wherein an area of each of the target display panels is smaller than an area of the display panel to be cut;
    providing a fixing device used for fixing the target display panels;
    wherein the fixing device comprises a carrier plate provided with a fixing member, the fixing member comprises at least two opening regions, an area of the opening regions is adjustable, and the opening regions are configured to accommodate the target display panels; and
    the fixing member comprises a plurality of first movable bars and a plurality of second movable bars, each of the first movable bars is disposed to intersect with each of the second movable bars, and an intersection between each of the first movable bars and each of the second movable bars is connected by a movable connection member; and
    adjusting a size of one of the opening regions of the fixing member in the fixing device to place the target display panels after edging into corresponding opening regions; and
    removing the protective layer on the target display panels.

16. The method of manufacturing the display panel as claimed in claim 15, wherein the protective layer has a thickness ranging from 2 um to 3 um.

17. The method of manufacturing the display panel as claimed in claim 15, wherein a material of the protective layer is a photoresist material.

* * * * *